Feb. 6, 1951 I. H. PAGE 2,540,137

WIDE RANGE TUNING CIRCUIT

Filed Dec. 14, 1943

Inventor
IRVING H. PAGE

By [signature]

Attorney

Patented Feb. 6, 1951 2,540,137

UNITED STATES PATENT OFFICE 2,540,137

WIDE RANGE TUNING CIRCUIT

Irving H. Page, Cheverly, Md.

Application December 14, 1943, Serial No. 514,245

2 Claims. (Cl. 250—40)

(Granted under the act of March 3, 1883, as amended April 30, 1928; 370 O. G. 757)

This invention relates to tunable parallel resonant circuits, and is particularly directed to such a circuit tunable over a frequency range broader than can be obtained by conventional circuits, while employing the same range of capacity variation.

It is accordingly an object of the invention to provide a tunable circuit covering a wide frequency range through capacity variation.

It is a further object of the invention to provide a parallel circuit tunable over a greatly extended range by simultaneous inductance and capacity variation.

Another object of the invention is to provide a widely tunable circuit for use in applications where it is shunted by fixed capacity.

It is also an object of the invention to provide a tuning circuit by which the effect of fixed shunting capacity is minimized.

The tuned circuit of the present invention is applicable to uses wherein a tuned parallel resonant circuit is shunted by fixed capacity. Manifestly the primary field of utility is in tuned radio circuits of receivers and oscillators. The invention is particularly beneficial when employed in the high frequency region where unavoidable tube interelectrode capacities are of the same order of magnitude as the tuning capacities. For purposes of illustration only, two embodiments shown in the drawing comprise high frequency oscillators.

In the drawings

Figure 1:
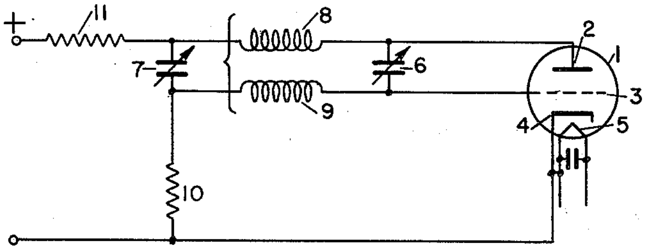
Fig. 1 shows a high frequency oscillator embodying the invention.

The oscillator shown in Fig. 1 includes triode 1 provided with anode 2, control electrode 3, cathode 4 and heater 5. The tank circuit includes variable capacity 6, and second variable capacity 7, the respective elements of the variable capacities being connected by inductances 8 and 9. The inductances are variably coupled. Common control means for operating the capacities and variable coupling inductors may be provided. As will be understood, such control will vary the coupling and the capacity values in the same direction.

Grid 3 is returned to ground through leak 10, and anode potential is supplied through resistor 11.

The oscillator frequency is determined by the tank circuit including capacity 7, capacity 6 in parallel with the grid anode capacity of triode 1, and inductances 8 and 9, together with the existing mutual inductance.

Figure 2:
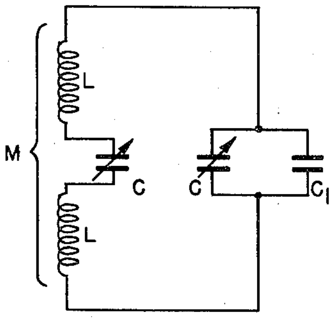
Fig. 2 shows the tuning circuit of the invention.

The tank circuit is shown in Fig. 2. Here it is assumed, for convenience, that the variable capacities are of the same value C, as are the inductances L. M is the mutual inductance. $C_1$ is the fixed shunting capacity. For resonance:

$$\frac{1}{W(C+C_1)}=W[2L+M]-\frac{1}{WC}$$

From which the resonant frequency may be ascertained to be $$W=\sqrt{\frac{2C+C_1}{C(C+C_1)(2L+M)}}$$

Whereas the specific arrangement shown in Fig. 1 is highly convenient in an oscillator of the type shown, it is apparent from the first equation above that the advantages derive from providing series capacity, part of which is in parallel with the shunting capacity, and part of which is free of shunting capacity, and is not dependent upon the arrangement of the inductance. However, it also appears from the second equation that a simultaneous variation of M with C will provide a further increase in frequency range ratio. By this means a range of 5.5 to 1 may be obtained in the 50 to 500 megacycles per second band.

Figure 3:
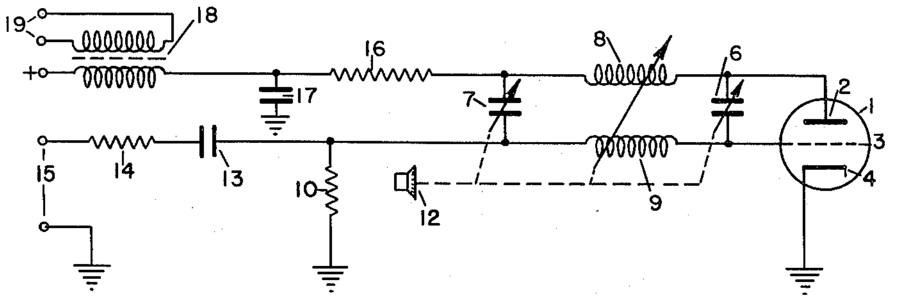
Fig. 3 shows a frequency converter embodying the invention.

A frequency converter employing variable inductive coupling is shown in Fig. 3. The oscillator components are the same as in Fig. 1 with the exception that inductors 8 and 9 are mounted for movement relative to each other under control of knob 12, which is also ganged to the variable capacities 6 and 7. The incoming signal is supplied to control element 3 through coupling capacity 13 and resistance 14 from input terminal 15. The output signal is obtained at 19 through transformer 18 coupled to the plate circuit by resistance 16 and capacity 17. It will be understood that such a converter, having a high frequency range coverage of more than 5 to 1, may be employed in monitoring a very broad section of the ultra high frequency spectrum.

Figure 4:
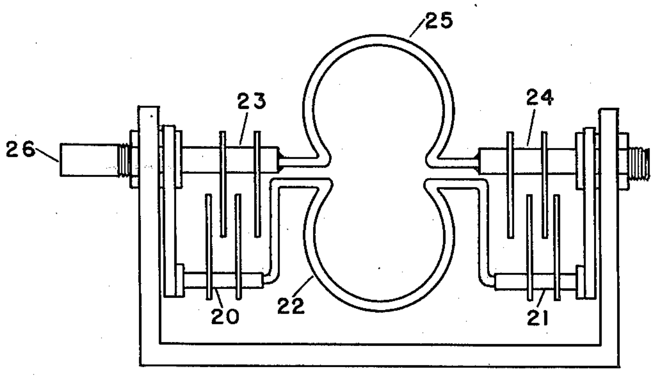
Fig. 4 shows a tuning unit of the present invention.

The use of the circuit of Fig. 3 permits a simplified physical construction of the variable capacitors and inductances which eliminates all but two sliding contact with attendant elimination of noise generation and inefficiency. Such construction is shown in Fig. 4. Condenser stators 20 and 21 carry interposed fixed inductor 22, while the rotors 23 and 24 are connected by movable inductor 25. The rotatable assembly is controlled by shaft extension 26, rotor 24 being driven by rotor 23 through inductor 25. The system of Figure 4 establishes maximum negative mutual inductance with minimum capacity, and the total inductive and capacitative reactances vary in the same direction with movement of the rotatable assembly. In Fig. 4 the condensers are shown fully meshed and the inductors with minimum coupling.

Such assembly, when incorporated in the circuit of Fig. 3, may have rotor 24 connected to anode 2 and stator 21 connected to grid 3.

The specific embodiments disclosed above do not define the limits of the invention, for which reference to the appended claims may be had.

The invention described herein may be manufactured and used by or for the Government of the United States of America for governmental purposes without the payment of any royalties thereon or therefor.

I claim:

1. A tuning unit for a wide range circuit comprising a pair of variable condensers each having a fixed element, and a movable element rotatable about an axis, a means positioning said condensers in spaced relationship with the said axes aligned, an inductor connected in driving relationship between the movable elements and positioned asymmetrically with respect to the aligned axes, and fixed inductance means connected between the said fixed condenser elements positioned adjacent the aligned axes in variable coupling relationship with the inductor.

2. A tuning unit comprising a mounting member, a pair of variable condensers each having fixed elements, shaft means rotatable relative thereto, and movable elements carried by the shaft means; the condensers being carried by the mounting member in spaced relationship with the shaft means aligned, first inductor means coupling the shaft means and rotatable therewith, thereby connecting the movable elements, and second inductor means carried by the mounting member in adjustable magnetic coupling to the first inductor means and connected between the fixed elements of the condensers.

IRVING H. PAGE.

REFERENCES CITED

The following references are of record in the file of this patent:

UNITED STATES PATENTS

| Number | Name | Date |
|---|---|---|
| 1,660,108 | Vignolo | Feb. 21, 1928 |
| 1,949,842 | Rechnitzer | Mar. 6, 1934 |
| 1,986,081 | Streiffert et al. | Jan. 1, 1935 |
| 2,011,299 | Polin | Aug. 13, 1935 |
| 2,081,711 | Polin | May 25, 1937 |
| 2,106,120 | Lindberg | Jan. 18, 1938 |
| 2,194,696 | Eickemeyer et al. | Mar. 26, 1940 |
| 2,272,851 | Ramsay | Feb. 10, 1942 |

FOREIGN PATENTS

| Number | Country | Date |
|---|---|---|
| 388,755 | Great Britain | Feb. 28, 1933 |
| 555,777 | Germany | Aug. 3, 1932 |